United States Patent
Kawakami et al.

(10) Patent No.: US 8,679,653 B2
(45) Date of Patent: *Mar. 25, 2014

(54) SPIN-VALVE RECORDING ELEMENT AND STORAGE DEVICE

(75) Inventors: Haruo Kawakami, Miura (JP); Yasushi Ogimoto, Higashiyamato (JP)

(73) Assignee: Fuji Electric Co., Ltd., Kawasaki-Shi (JP)

( * ) Notice: Subject to any disclaimer, the term of this patent is extended or adjusted under 35 U.S.C. 154(b) by 298 days.

This patent is subject to a terminal disclaimer.

(21) Appl. No.: 12/737,118

(22) PCT Filed: Sep. 5, 2008

(86) PCT No.: PCT/JP2008/066073
§ 371 (c)(1),
(2), (4) Date: Feb. 16, 2011

(87) PCT Pub. No.: WO2009/157100
PCT Pub. Date: Dec. 30, 2009

(65) Prior Publication Data
US 2011/0143166 A1 Jun. 16, 2011

(30) Foreign Application Priority Data
Jun. 24, 2008 (JP) .................. 2008-164284

(51) Int. Cl.
*H01F 10/08* (2006.01)
*H01L 43/08* (2006.01)
*H01L 43/12* (2006.01)

(52) U.S. Cl.
USPC ........ 428/811; 428/811.5; 257/421; 365/158; 365/171; 365/172; 365/173; 360/324.12

(58) Field of Classification Search
None
See application file for complete search history.

(56) References Cited

U.S. PATENT DOCUMENTS

| 5,862,022 | A | 1/1999 | Noguchi et al. |
| 6,654,278 | B1 | 11/2003 | Engel et al. |
| 6,956,257 | B2 * | 10/2005 | Zhu et al. ............... 257/295 |
| 7,095,646 | B2 * | 8/2006 | Slaughter et al. ....... 365/158 |
| 7,592,189 | B2 * | 9/2009 | Iwata et al. ............. 438/3 |

(Continued)

FOREIGN PATENT DOCUMENTS

| JP | 10-091925 A | 4/1998 |
| JP | 2003-031771 A | 1/2003 |

(Continued)

OTHER PUBLICATIONS

B.A. Ivanov et al, "Excitation of Spin Dynamics by Spin-Polarized Current in Vortex State Magnetic Disks", Phys. Rev. Lett. No. 99, 247208, The American Physical Society, Dec. 14, 2007.

(Continued)

*Primary Examiner* — Kevin Bernatz
(74) *Attorney, Agent, or Firm* — Rabin & Berdo, P.C.

(57) ABSTRACT

A spin-valve element has a pair of ferromagnetic layers having mutually different coercive forces, sandwiching an insulating layer or a nonmagnetic layer therebetween. The in-plane shape of the spin-valve element is substantially circular in shape but is provided, in the peripheral portion, with a plurality of cutouts $N_S$, $N_W$, $N_E$, $N_N$. Preferably, the shape of at least one cutout be made different from that of others. Moreover, a storage device that employs such a spin-valve element is provided.

16 Claims, 13 Drawing Sheets

(56) References Cited

U.S. PATENT DOCUMENTS

| | | | |
|---|---|---|---|
| 7,599,156 B2* | 10/2009 | Kishi et al. | 360/324.11 |
| 7,929,342 B2* | 4/2011 | Numata et al. | 365/171 |
| 8,009,465 B2* | 8/2011 | Nakayama et al. | 365/158 |
| 8,013,407 B2* | 9/2011 | Takenaga et al. | 257/421 |
| 8,257,596 B2* | 9/2012 | Mather et al. | 216/22 |
| 8,269,295 B2* | 9/2012 | Takenaga et al. | 257/421 |
| 8,362,581 B2* | 1/2013 | Takenaga et al. | 257/421 |
| 8,427,866 B2* | 4/2013 | Takenaga et al. | 365/171 |
| 2003/0169147 A1* | 9/2003 | Higo | 338/32 R |
| 2003/0185050 A1* | 10/2003 | Kishi et al. | 365/173 |
| 2004/0012994 A1 | 1/2004 | Slaughter et al. | |
| 2004/0021539 A1* | 2/2004 | Bland et al. | 335/302 |
| 2005/0078417 A1* | 4/2005 | Kishi et al. | 360/324.2 |
| 2005/0219771 A1* | 10/2005 | Sato et al. | 360/324.2 |
| 2005/0226040 A1* | 10/2005 | Zhu et al. | 365/158 |
| 2007/0247901 A1 | 10/2007 | Akinaga et al. | |
| 2008/0030906 A1* | 2/2008 | Sato | 360/324.2 |
| 2009/0180311 A1 | 7/2009 | Ono et al. | |
| 2011/0086440 A1* | 4/2011 | Boone et al. | 438/3 |
| 2011/0102939 A1* | 5/2011 | Kawakami et al. | 360/97.01 |
| 2011/0188297 A1* | 8/2011 | Ogimoto et al. | 365/158 |

FOREIGN PATENT DOCUMENTS

| | | |
|---|---|---|
| JP | 2004-363350 A | 12/2004 |
| JP | 2005-535111 A | 11/2005 |
| JP | 2005-535115 A | 11/2005 |
| JP | 2007-317895 A | 12/2007 |
| WO | WO-2006/092849 A1 | 9/2006 |
| WO | WO-2007/105358 A1 | 9/2007 |

OTHER PUBLICATIONS

J. Shibata et al, "Current induced magnetic vortex motion by spin-transfer torque", Phys. Rev. B., No. 73, 020403, The American Physical Society, Jan. 4, 2006.

* cited by examiner

SPIN-VALVE RECORDING ELEMENT AND STORAGE DEVICE

BACKGROUND OF THE INVENTION

This invention relates to a recording element having a spin-valve structure and to a storage device, and more specifically to a spin-valve recording cell structure capable of information writing and reading by controlling the direction of the magnetization vector of a magnetized ferromagnetic layer, and to a storage device utilizing such a recording cell structure.

In recent years, advances in nanoelectronics have been accompanied by product development in fields applying physical phenomena specific to minute-sized magnetic materials. Of these fields, there have been particularly rapid advances in the field which utilizes the spin of free electrons in magnetic materials (hereafter called "spin electronics").

In spin electronics, devices currently thought to have the highest possibility of practical application are spin-valve elements which apply the tunneling magnetoresistance (TMR) effect occurring in a layered structure of a ferromagnetic layer/insulating layer/ferromagnetic layer or the giant magnetoresistance (GMR) effect occurring in a layered structure of a ferromagnetic layer/nonmagnetic layer (conductive layer)/ferromagnetic layer. The slash (/) symbol appearing between layers indicates that the preceding and following layers are layered in the order indicated.

FIG. 1 and FIG. 2 show examples of the configurations of spin-valve elements of the prior art. Of these, FIG. 1 shows the basic configuration portion of a spin-valve element utilizing TMR. This element comprises, configured on a substrate 5, one insulating layer 24, a pair of ferromagnetic layers 23 (fixed layer) and 25 (free layer) sandwiching the insulating layer 24, and electrode layers 21 and 27, with an antiferromagnetic layer (pinning layer) 22, a capping layer 26, and similar structures added as necessary. The magnetization of the fixed layer 23 is fixed by magnetic coupling with the antiferromagnetic layer 22 and similar structures. The magnetization of the free layer 25 is controlled by spin injection by an external magnetic field or by a spin-polarized current. Reference number 30 designates an insulating element and reference number 31 designates wiring.

In control by spin injection, when electrons are passed to this element from the fixed layer 23, a torque acts so as to make the spin of the free layer 25 parallel to that of the fixed layer 23. Conversely, when electrons are passed from the free layer 25 toward the fixed layer 23, a torque acts so as to make the spin of the free layer 25 antiparallel to that of the fixed layer 23. Through this action, the magnetization direction of the free layer 25 can be controlled through the current direction (magnetization reversal by spin injection).

In this way, by causing the direction of the magnetization of the free layer and fixed layer to rotate or reverse according to spin injection by an external magnetic field or a spin-polarized current, the resistance of the element changes greatly according to the magnetization directions of both. That is, an element is configured such that when the magnetization vectors of both are antiparallel, the highest resistance value is obtained, and when the magnetization vectors of both are parallel, the lowest resistance value is obtained.

FIG. 2 shows the basic configuration portion of a spin-valve element utilizing GMR. A difference with the element utilizing TMR of FIG. 1 is that the insulating layer (conductive layer) 24 is replaced with a nonmagnetic layer 51; otherwise the functions are essentially the same.

Using these elements, solid-state magnetic memory devices which record one bit of information per element have been proposed, and multivalue recording techniques capable of recording two bits of information per element have also been proposed. Two states (two values) can be recorded for one bit, and four states (four values) can be recorded for two bits.

Patent Reference 1: Japanese Patent Application Laid-open No. H10-91925.
Patent Reference 2: Japanese Patent Application Laid-open No. 2003-31771.
Patent Reference 3: Japanese Patent Application Laid-open No. 2007-317895.
Patent Reference 4: Japanese Translation of PCT Application No. 2005-535111.
Non-patent Reference 1: B. A. Ivanov et al, "Excitation of Spin Dynamics by Spin-Polarized Current in Vortex State Magnetic Disks", Phys. Rev. Lett. No. 99, 247208, The American Physical Society, Dec. 14, 2007.
Non-patent Reference 2: J. Shibata et al, "Current induced magnetic vortex motion by spin-transfer torque", Phys. Rev. B., No. 73, 020403, The American Physical Society, Jan. 4, 2006.

However, there are various problems to be solved in technology for multivalue recording of the prior art, and commercialization has not yet been attained.

For example, Patent Reference 1 (Japanese Patent Application Laid-open No. H10-91925) proposes a solid-state magnetic memory device employing a multivalue recording technique capable of storing two bits of information per element, obtained by forming a dual-structure tunnel junction element having the layered structure of a ferromagnetic layer/first insulating layer (or first nonmagnetic layer)/ferromagnetic layer/second insulating layer (or second nonmagnetic layer)/ferromagnetic layer. In this solid-state magnetic memory device, a multiple-structure element structure is necessary, and between the layered configuration of a ferromagnetic layer/first nonmagnetic layer/ferromagnetic layer and the layered configuration of a ferromagnetic layer/second nonmagnetic layer/ferromagnetic layer, the level of the output voltage detects across the ferromagnetic layers of each is differentiated and detected. Hence there is the problem that in the solid-state magnetic memory device of Patent Reference 1, if the magnetoresistance exhibited by at least one among the two layered configurations contained in the solid-state magnetic memory device is not larger than the magnetoresistance exhibited by the ferromagnetic layer/nonmagnetic layer/ferromagnetic layer single-structure tunnel junction TMR element (the other TMR element), an adequate S/N ratio cannot be secured.

Further, Patent Reference 2 (Japanese Patent Application Laid-open No. 2003-31771) discloses a method in which two ferromagnetic layers are layered with a nonmagnetic layer intervening, formed such that the magnetization directions of the two ferromagnetic layers are mutually perpendicular, and by means of this combination one bit can be stored in each of the ferromagnetic layers, so that in both a total of two bits in four states can be stored independently. In this method, there are the problems that a multiple structure is necessary, and that moreover by generating magnetic fields in both forward and reverse directions for each of the magnetic fields, for a total of four directions, so that switching using an external magnetic field must be performed.

Further, Patent Reference 3 (Japanese Patent Application Laid-open No. 2007-317895) discloses a structure in which two standby portions are made adjacent to a free layer, and which has a notch which pins domain walls corresponding to each of the standby portions. In this method, there is the problem that because the lateral-direction area is large in the standby portions only, even if multivalue recording is realized, the recording density is not improved.

And, Patent Reference 4 (Japanese Translation of PCT Application No. 2005-535111) discloses a free layer which has a plurality of stable positions due to a shape anisotropy of the free layer; but there is the problem that in order to induce the shape anisotropy, the shape becomes irregular, and thus the reversal magnetic field is increased.

DISCLOSURE OF THE INVENTION

This invention has as an object the resolution of any of the problems to be solved of the above-described prior art.

In order to solve the above problems, this invention provides a spin-valve element, which has an intermediate layer containing an insulating layer or a nonmagnetic layer, and a pair of ferromagnetic layers sandwiching the intermediate layer, and in which coercive forces of the pair of ferromagnetic layers are mutually different, wherein at least the in-plane shape of the ferromagnetic layer having a smaller coercive force is substantially circular, provided, in a peripheral portion thereof, with a plurality of cutouts.

In a spin-valve element of this invention, it is preferable that the shape of at least one of the plurality of cutouts be not congruent with other cutouts.

In a spin-valve element of this invention, it is preferable that the in-plane shape be substantially circular, with a major axis:minor axis aspect ratio thereof being 1:1 or greater and 102:98 or smaller.

In addition, in a spin-valve element of this invention, it is preferable that the minimum value X of the cutout length be $X \geq 0.4$ R. Here R is the effective radius of the spin-valve element; the effective radius is defined as $(S/\pi)^{0.5}$, where S is the area of the spin-valve element.

And, in a spin-valve element of this invention, it is preferable that the widths Y of all cutouts be such that $L \leq Y \leq 5.5$ L. Here L is defined by $L=(\mu_0 A/Ms^2)^{0.5}$, and is the exchange interaction distance of the ferromagnetic material with lower coercive force among the pair of ferromagnetic layers; A is the exchange stiffness constant (unit: J/m), Ms is the saturation magnetization (unit: T) of the material of the ferromagnetic layer with the lower coercive force, and $\mu_0$ is the permeability of vacuum, equal to $1.257 \times 10^{-6}$ (unit: H/m).

This invention can also be implemented as a storage device. That is, this invention provides a storage device which uses, as a storage element, any of the above-described spin-valve elements.

By means of any of the embodiments of this invention, spin-valve element capable of multivalue recording can be provided which enables high recording densities without using multiple structures or other complex structures, and which affords at least one of the benefits among reduction of the magnetization reversal current in spin-valve elements utilizing spin injection magnetization reversal, and faster magnetization reversal; further, a storage device using such spin-valve elements can also be provided.

DESCRIPTION OF THE PREFERRED EMBODIMENTS

The spin-valve element of an embodiment of this invention has an in-plane shape that is substantially circular, and is provided with a plurality of cutouts (notches) in the peripheral portion, that is, on the outer edge of the circular shape. In this way, the shape anisotropy of the spin-valve element is reduced and the magnetic field necessary for recording is decreased, and a state is realized in which an in-plane magnetization pattern in the free layer is fixed through the action of any of the cutouts. By means of this configuration, there exist stable states of the free layer magnetization distribution equal in number to the number of cutouts provided, and a multivalue recording element can be realized through a simple configuration.

In particular, by means of a configuration in which the shape of at least one among the plurality of cutouts is not congruent with the shape of other cutouts, a vortex can be induced in the free layer magnetization, and vortex-shape magnetization can be realized. That is, vortex-shape magnetization can be realized even when there are no cutouts depending on the action resulting from the magnetic characteristics, shape, and size of the magnetic film; but the inventors of this application discovered that by causing the initial magnetization state to be a stable state of parallel magnetization, and by causing the cutout shapes to be non-homogeneous as described above, a vortex can be induced in the magnetization. Further, the inventors also discovered that under specific conditions, a characteristic magnetization pattern, in which the vortex is fixed by each of the cutouts, can be formed. The cutout which fixes the vortex can be selected by controlling the magnetization by means of an external magnetic field, spin injection, or similar means.

As stated above, Patent Reference 4 (Japanese Translation of PCT Application No. 2005-535111) discloses the inducement of shape anisotropy and fabrication of a plurality of stable positions by making the in-plane shape of the free layer unbalanced, starting from a shape with good symmetry. However, when the in-plane shape is made sufficiently unbalanced that a shape anisotropy is induced, it is necessary to increase the magnetic field to perform recording, resulting in a major problem for practical use.

The above will be explained in greater detail. The magnetization reversal behavior of a thin film is generally expressed by the Landau-Lifshitz-Gilbert equation (LLG equation), given by equation (1).

$$dm/dt = \gamma m \times H_{eff} + \alpha m \times dm/dt \quad (1)$$

Here m is the unit vector indicating the direction of magnetization in the thin film, $\gamma$ is the gyromagnetic ratio, $H_{eff}$ is the effective magnetic field vector, and $\alpha$ is the Gilbert damping constant.

Figure 3A:
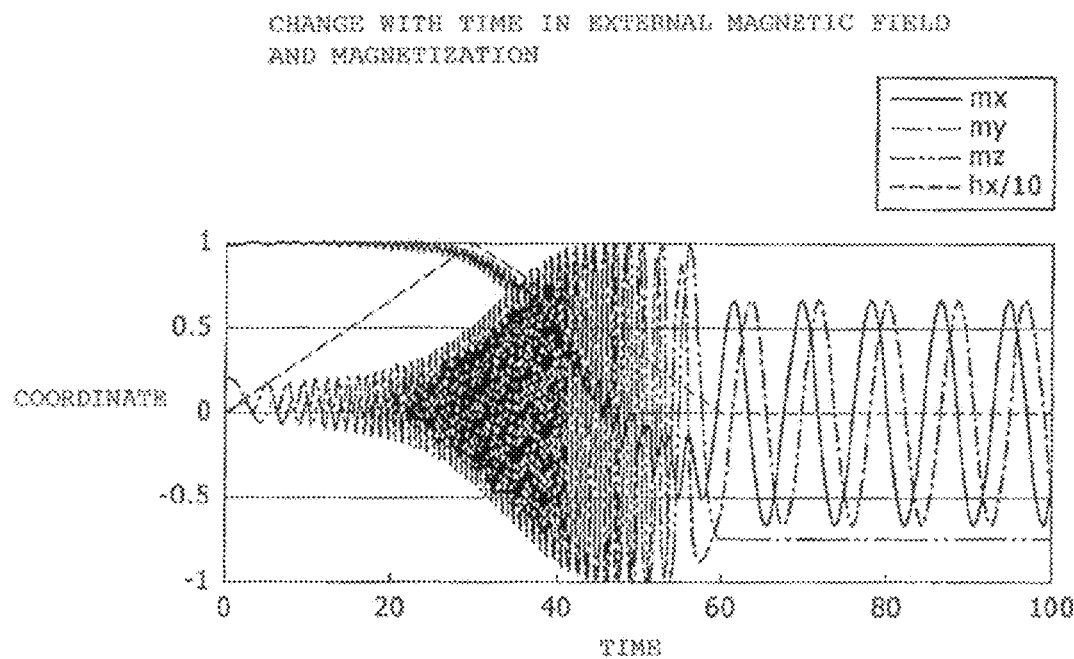
FIGS. 3A and 3B show an example of macro spin model analysis of magnetization behavior in a circular thin film (circular, external magnetic field peak value 5 kA/m)
Figure 3B:
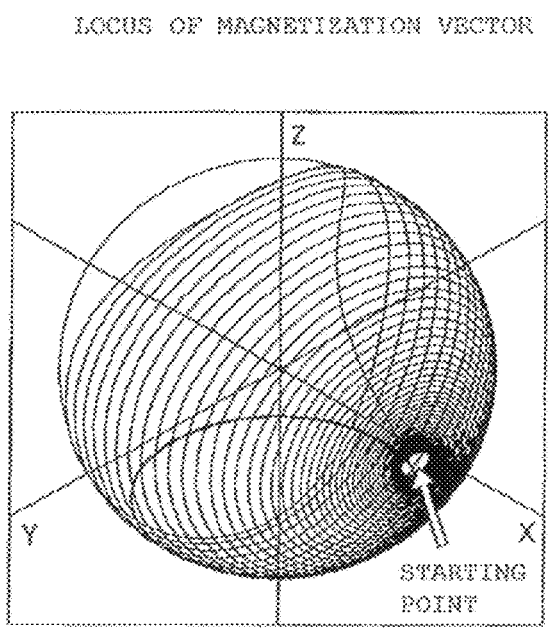

FIGS. 3A and 3B show an example of analysis using this equation of the magnetization reversal behavior of a thin film using a macro spin model, in which the entire thin film is approximated by a single spin. Here the physical properties of a material 1 given in Table 1 are assumed for the thin film, the magnetization unit vector in the initial state is taken to be $(m_x, m_y, m_z) = (0.99, 0.1, 0.0)$, and the magnetization reversal behavior when an external magnetic field pulse of 5 kA/m is applied in the −x direction is analyzed. The pulse shape of the external magnetic field was taken to have a triangular shape with a rise time of 1.0 ns, holding time of 0 ns, and fall time of 1.0 ns. In FIG. 3A, the time units are normalized by $(\gamma Ms)^{-1}$ (where Ms is the saturation magnetization), and 30 time units are equivalent to 1 ns.

TABLE 1

| | Material | | |
|---|---|---|---|
| | 1<br>$Co_{60}Fe_{20}B_{20}$ | 2<br>$Ni_{78}Fe_{22}$ | 3<br>$Co_{57}Fe_{31}B_{12}$ |
| Ms, saturation magnetization (T) | 1.08 | 0.86 | 1.90 |
| Ku, magnetic anisotropy ($J/m^3$) | $2.4 \times 10^2$ | 1.7 | $1.4 \times 10^3$ |
| A, exchange coupling stiffness (J/m) | $1.3 \times 10^{-11}$ | $1.3 \times 10^{-11}$ | $1.3 \times 10^{-11}$ |
| L, exchange length (nm) = $(\mu_0 A/Ms^2)^{0.5}$ | 3.7 | 4.7 | 2.1 |
| 5.5 L (nm) | 20.6 | 25.9 | 11.7 |

Figure 4:
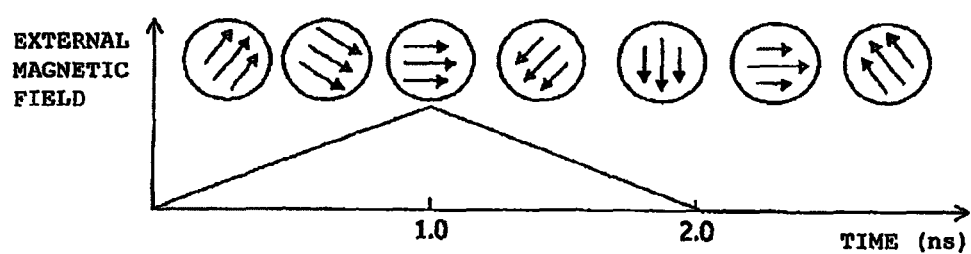
FIG. 4 is an explanatory diagram of one example (Comparative Example 1) of magnetization behavior when an external magnetic field is applied to a spin-valve element.

In FIG. 3A, during the 0 ns to 2.0 ns (unit times 0 to 60) in which the external magnetic field pulse is applied, the magnetization of the free layer precesses about the x axis which is the direction of the external magnetic field, but after the end of the magnetic field pulse, the center of rotation of the precession becomes the z axis perpendicular to the thin film (the demagnetizing field direction), and the precession continues. FIG. 4 is an explanatory diagram showing an example of magnetization behavior when, under the same conditions, an external magnetic field is applied to a spin-valve element, and shows results obtained by micromagnetic analysis. In FIG. 4 also, similarly to FIGS. 3A and 3B, oscillation is confirmed to continue. Thus in a simple circular thin film, the magnetization cannot easily be fixed even when the thin film magnetization is reversed by an external magnetic field, and such a thin film does not function as a practical recording element.

Figure 5:
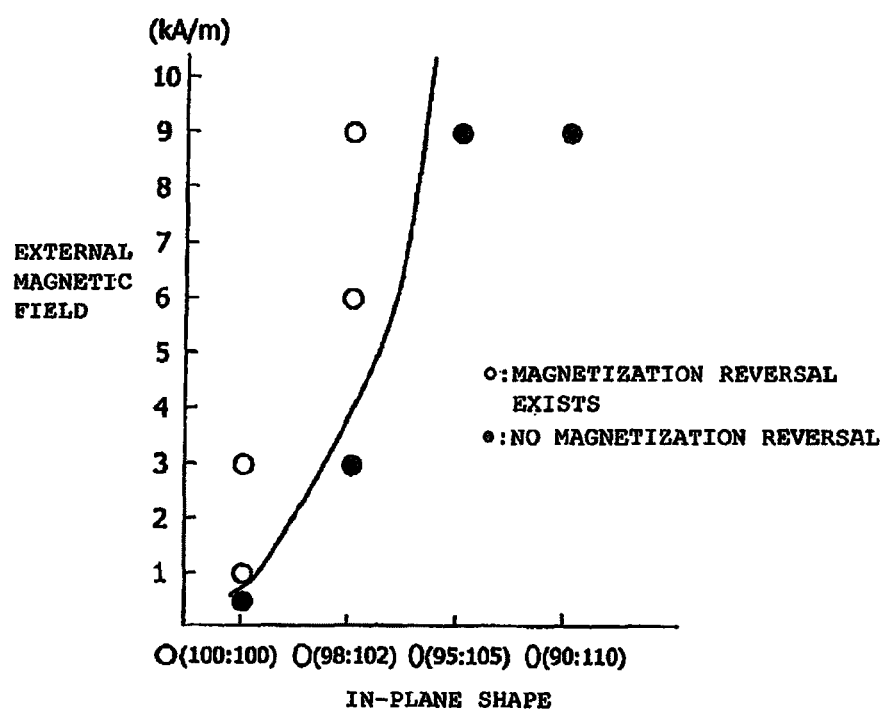
FIG. 5 is an explanatory diagram showing the relation between aspect ratio and reversal magnetic field in an ellipsoidal shape.

In order to solve this problem, in many of the spin-valve elements currently in use, the in-plane shape is made ellipsoidal and a shape anisotropy imparted, to stabilize the magnetization direction along the major axis. By this means, a stable state in two directions is obtained, but due to the shape anisotropy, the recording magnetic field is increased. FIG. 5 shows calculations of the relation between the ellipse aspect ratio and the reversal magnetic field; it is seen that for a minor axis:major axis aspect ratio of 98:102 or greater (a major axis:minor axis aspect ratio of 102:98 or lower), the magnetic field necessary to cause magnetization reversal (the reversal magnetic field, the boundary line in the figure) increases abruptly.

Figure 6:
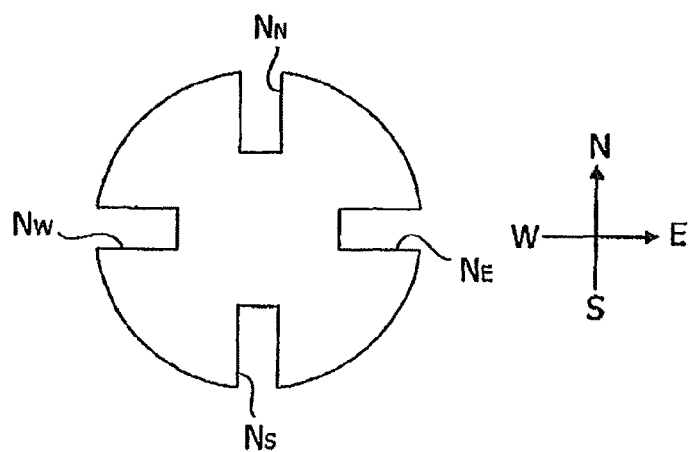
FIG. 6 is an explanatory diagram showing one example of in-plane shape in a spin-valve element of this invention.

FIG. 6 shows an example of the in-plane shape of an embodiment of a spin-valve element of the invention. The in-plane shape is basically circular, and four rectangular cutouts, $N_S$, $N_W$, $N_N$, $N_E$ are formed in the outer edge portion of the circle directed toward the center. In the following explanation, the thin film dimensions are assumed to be diameter 100 nm, thickness 20 nm, and the cutout dimensions are assumed to be width 12.5 nm, length 25 nm. In the explanation, for convenience in specifying the cutouts, the compass directions shown on the right in FIG. 6 are used as cutout notations.

(Write Operations)

Figure 7:
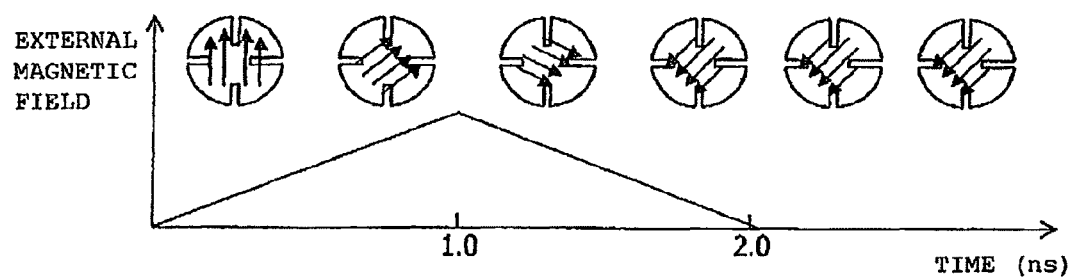
FIG. 7 is an explanatory diagram showing one example (analysis example 1) of magnetization behavior when an external magnetic field is applied to a spin-valve element of this invention.

First, as shown in FIG. 6, when four cutouts with the same shape are formed, the initial magnetization state is set to the upward direction (N direction) in the figure, and an external magnetic field in the downward direction (S direction) in the figure is applied, the magnetization distribution in the thin film changes as shown in FIG. 7. FIG. 7 is an explanatory figure showing one example of magnetization behavior when an external magnetic field is applied to the spin-valve element of this example. Due to the shape anisotropy of the thin film, magnetization stable points occur, and the magnetization distribution is stable. The magnetization distribution in this case is such that the magnetization is substantially parallel within the thin film, and stable states are obtained in which the magnetization direction is between cutouts. In FIG. 7, a stable state is obtained in which the magnetization is directed in between in the SW direction (S direction and W direction).

Figure 8:
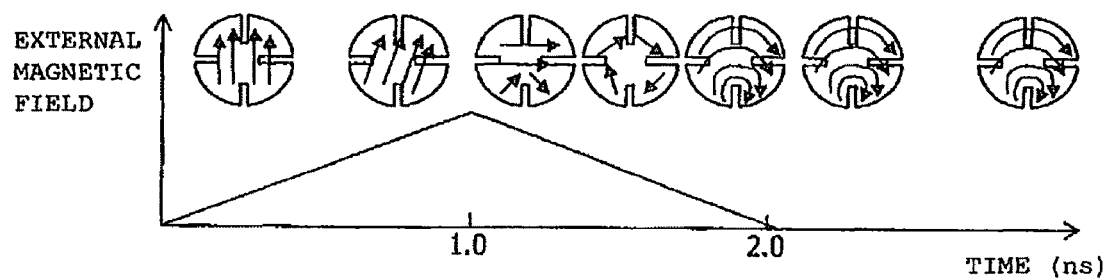
FIG. 8 is an explanatory diagram showing one example (analysis example 2) of magnetization behavior when an external magnetic field is applied to a spin-valve element of this invention.

Of the four cutouts, by setting the cutout length in the S direction to be somewhat longer (28 nm) than the other three, and applying a magnetic field similarly to that above, a vortex-shape magnetization distribution could be obtained. FIG. 8 is an explanatory diagram showing an example of magnetization behavior when the external magnetic field is applied to a spin-valve element in the embodiment of the present invention. The initial state is a state of parallel magnetization directed in the N direction. An external magnetization directed in the S direction is applied, with a slope rising interval of 1 ns and falling interval of 1 ns. As shown in FIG. 8, after applying the external magnetic field, the magnetization vortex is fixed at the cutout in the S direction. That is, the magnetization distribution in the thin film is a parallel magnetization before applying a magnetic field, but application of a magnetic field causes the changes as in FIG. 8, and after the end of the external magnetic field, a vortex-shape magnetization distribution is obtained in which the magnetization vector describes a circular arc in the vicinity of a cutout, and stabilizes in this state. In this way, in this embodiment of the invention, by keeping the basic in-plane shape circular the reversal magnetic field is suppressed while realizing a function of stabilizing the magnetization by means of a cutout after the end of the external magnetic field.

Figure 9A:
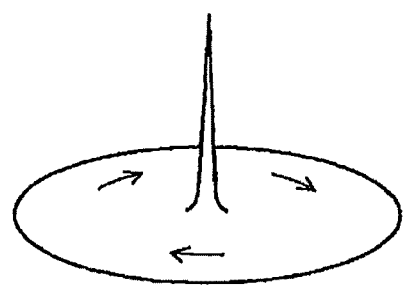
FIGS. 9A and 9B are explanatory diagrams of a vortex-shape magnetization structure, in which (a) is a solid-figure view, and (b) is a plane view in which magnetization is indicated by arrows.
Figure 9B:
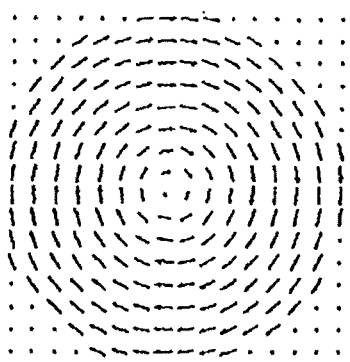
Figure 10A:
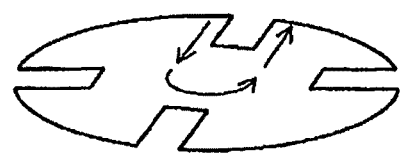
FIGS. 10A and 10B are explanatory diagrams of the magnetization distribution in the vicinity of a cutout, obtained in this invention, in which (a) is a solid-figure view, and (b) is a plane view in which magnetization is indicated by arrows.
Figure 10B:
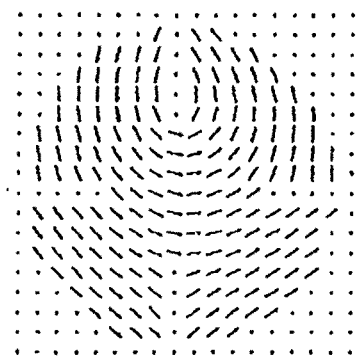

Further, the magnetization distribution in the vicinity of a cutout obtained in this way is a vortex-shape magnetization such that the vortex center is positioned in the cutout, and is equivalent to a magnetization state such that the vortex is fixed at the cutout. That is, the magnetization distribution within a single domain of the magnetic film is broadly divided into general parallel magnetization, and vortex-shape magnetization. FIGS. 9A and 9B show the magnetization distribution of vortex-shape magnetization; at the center of the vortex-shape magnetization structure, the in-plane magnetization distribution is mutually antiparallel, and so in order to reduce the exchange energy, the magnetization rises in the perpendicular direction as shown in FIG. 9A. On the other hand, details of the magnetization distribution in the vicinity of a cutout obtained in this embodiment of the invention are shown in FIGS. 10A and 10B; the in-plane magnetization distribution is such that the magnetization describes a circular arc in the vicinity of the cutout, and the vortex has a drawn-out shape. It should be noted that the vortex center is positioned in a hollow portion of the cutout, and that the central perpendicularly oriented magnetization portion seen in FIGS. 9A and 9B is eliminated. As stated above, at the vortex center, it is inferred that the magnetostatic energy is increased in order to compensate for the exchange energy, but in the present element this portion is eliminated, and so the energy is inferred to be low, and this is inferred to be a cause of stabilization of the vortex at the cutout.

Further, even when the magnetization distribution of the free layer is changed using an external magnetic field in this way, because of the high coercive force of the fixed layer, it is possible to keep the magnetization distribution from changing. By separately controlling the magnetization distributions of the free layer and the fixed layer in this way, the electrical resistance of the spin-valve element can be controlled, and operation as a recording element is realized.

Further, in the above an example of a recording process using an external magnetic field was explained; but vortex movement by spin injection is also possible, and the in-plane shape can similarly be utilized to realize vortex movement.

Figure 11:
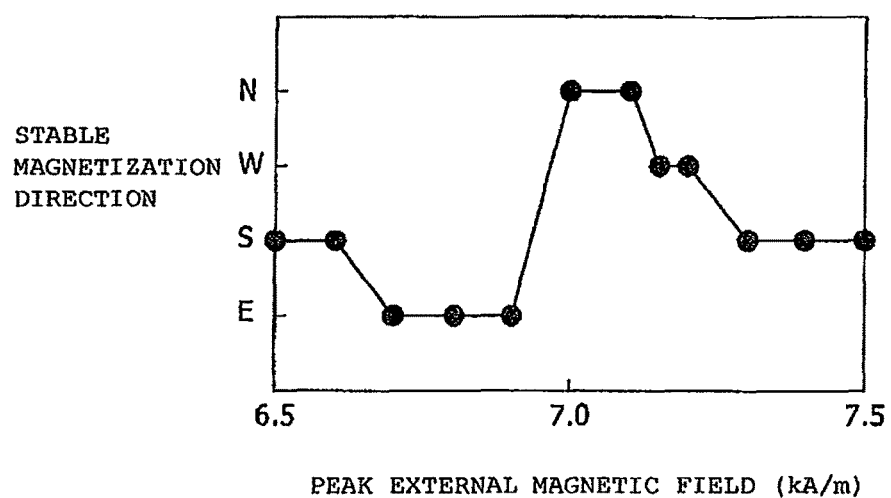
FIG. 11 is an explanatory diagram showing one example of the relation between external magnetic field and magnetic field distribution stable points in a spin-valve element of this invention.

In particular, it is known that the position of a vortex in a free layer can be moved so as to rotate by spin injection from a fixed layer having perpendicular magnetization anisotropy (Non-patent Reference 1), and by spin injection using a free layer in-plane current (Non-patent Reference 2). Vortex movement between cutouts by such rotational movement involves successive movement of the vortex to adjacent cutouts, and the fixing cutout can easily be specified, which is advantageous. FIG. 11 shows one example of the relation between the external magnetic field and magnetization distribution stable points in the spin-valve element of this embodiment of the invention. The cutouts in this example are formed in N/E/S/W directions of the circular thin film, and the cutout in the S direction is formed so as to be slightly longer than the cutouts in the other three directions. As shown in FIG. 11, by for example increasing the peak value of the external magnetic field (the value of the magnetic field at 1.0 nsec in FIG. 7, for example) from 6.5 to 7.5 kA/m, the position of the cutout at which the vortex is fixed moves successively so as to rotate counterclockwise, and conversely, when decreased in this range, movement is successively in a clockwise rotation. When the peak value of the external magnetic field is near 6.5 kA/m and 7.5 kA/m, the slightly longer S-direction cutout is a stable vortex position.

(Read Operations)

Figure 12A:
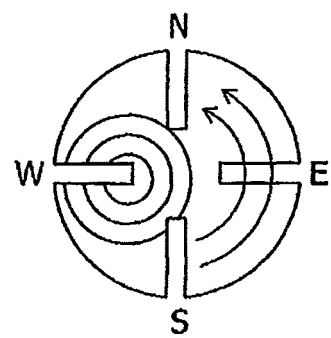
FIGS. 12A, 12B, and 12C are explanatory diagrams of the magnetization distribution in a spin-valve element of this invention, in which (a) is a free layer, (b) is a pinning layer having perpendicular magnetization anisotropy, and (c) is a pinning layer having in-plane magnetization anisotropy.
Figure 12B:
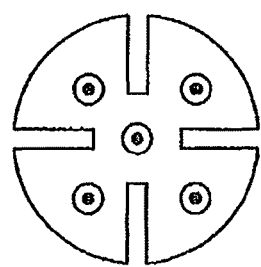
Figure 12C:
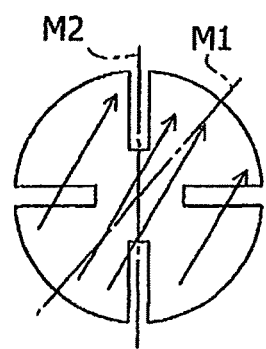

On the other hand, in order to read out differences in the vortex position in the free layer, it is necessary to detect the electrical resistance between the fixed layer having in-plane magnetization anisotropy and the free layer. FIGS. 12A, 12B, and 12C illustrate the arrangement of magnetization in order to explain the readout operation. As shown in FIG. 12A, when the magnetization arrangement in the free layer has a vortex, if the fixed layer has perpendicular magnetization anisotropy and is magnetized perpendicularly as shown in FIG. 12B, no difference in electrical resistance occurs regardless of the cutout at which the vortex is fixed in the free layer; but if the fixed layer has in-plane magnetization anisotropy and is magnetized in-plane as in FIG. 12C, the electrical resistance differs depending on the cutout at which the vortex is fixed, and the vortex position can be detected from the electrical resistance value. However, if at this time the magnetization direction in the fixed layer coincides with the symmetry axis as indicated by the dot-dash line M1 in FIG. 12C, the electrical resistance is the same when the magnetization vortex position in the free layer is at the E and S cutouts among the four cutouts, and the electrical resistance is the same when at the N and W cutouts. Hence the four vortex positions cannot be discriminated, and only two values can be recorded. Further, when the fixed layer magnetization direction coincides with the symmetry axis as indicated by the dot-dash line M2 in FIG. 12C, the electrical resistance is the same when the magnetization vortex position in the free layer is the N and S cutouts among the four cutouts. Hence the four vortex positions cannot be discriminated, and only three values can be recorded. In this case also, an advantageous result of this embodiment of the invention is maintained; but in order to record a greater number of values, a configuration is preferable in which the magnetization direction of the fixed layer does not coincide with the symmetry axis of the fixed layer in-plane shape. In addition to the above dot-dash lines M1 and M2, there are three other symmetry axes equivalent to each of these.

Figure 13A:
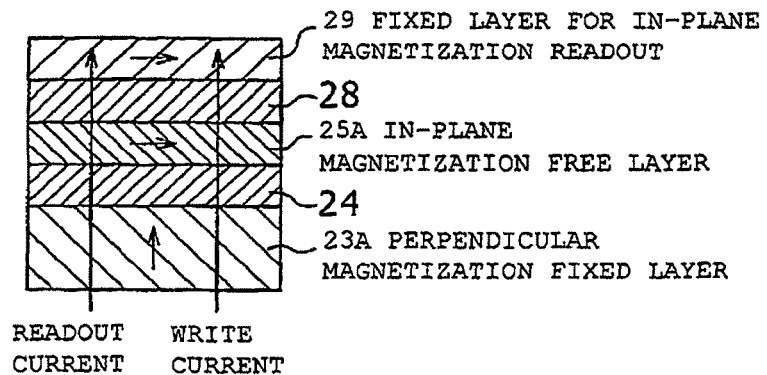
FIGS. 13A and 13B are explanatory diagrams showing an example of the structure of a spin-injection type spin-valve element in this invention, in which (a) is an example of a structure having a pinning layer for perpendicular magnetization writing and a pinning layer for in-plane magnetization reading, and (b) is an example of a structure having an electrode for in-plane spin injection and an in-plane magnetization pinning layer.
Figure 13B:
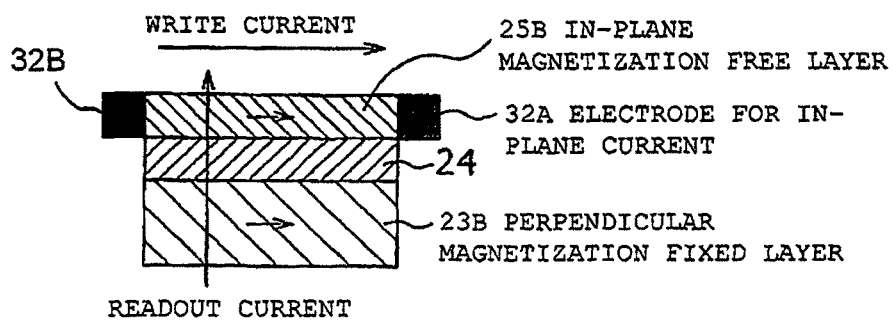

Further, if spin injection is performed using only the fixed layer with magnetization arrangement as shown in FIG. 12B, readout is not possible. Consequently when a fixed layer having perpendicular magnetic anisotropy is used, only the same electrical resistance is exhibited regardless of the cutout position of the vortex in the free layer, and it is necessary to provide a fixed layer for readout having in-plane magnetic anisotropy for the purpose of readout. FIGS. 13A and 13B show an example of the structure of a spin injection-type spin valve element in an embodiment of the invention. Here FIG. 13A is an example of a structure having a pinning layer for perpendicular magnetization writing and a pinning layer for in-plane magnetization readout, and FIG. 13B is an example of a structure having an electrode for in-plane spin injection and an in-plane magnetization pinning layer. As shown in FIG. 13A, a series structure can be used in which an in-plane magnetization free layer 25A is enclosed between a fixed layer for writing having perpendicular magnetic anisotropy (perpendicular magnetization fixed layer) 23A and a fixed layer for readout having in-plane magnetic anisotropy (in-plane magnetization readout fixed layer) 29. Further, when utilizing rotational movement of the vortex by spin injection using an in-plane current in the free layer, a structure is also conceivable having electrodes for writing (in-plane current electrodes) 32A and 32B as free layer in-plane current electrodes, as shown in FIG. 13B.

In particular, the cutout at which the vortex is fixed can be controlled through the intensity and time of the applied external magnetic field. By this means, the same number of stable states as the number of cutouts is realized, and a multivalue recording element is made possible. A still more important feature is the fact that if the above-described rotational movement by spin injection is used, then fixing at any of the cutouts is possible using current in one direction. That is, in a spin-valve element of the prior art, current with both positive and negative polarities was necessary, but by means of an element of an embodiment of this invention, element driving control during recording is possible using only single-polarity current.

(Procedure for Element Fabrication)

Figure 1:
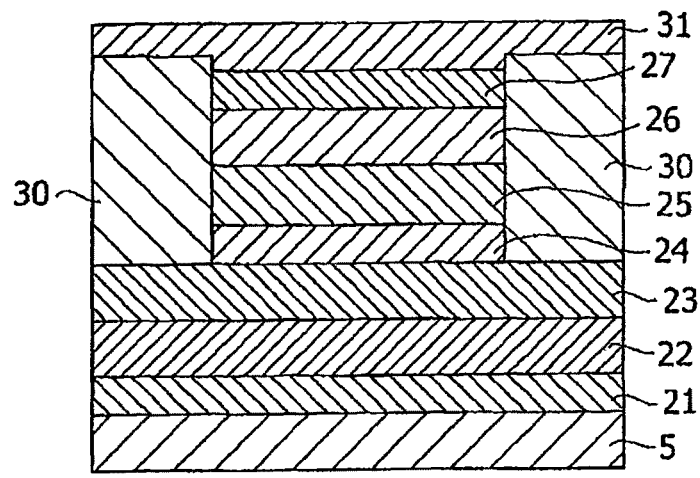
FIG. 1 is a cross-sectional view showing the basic configuration portion of a spin-valve element utilizing TMR.
Figure 2:
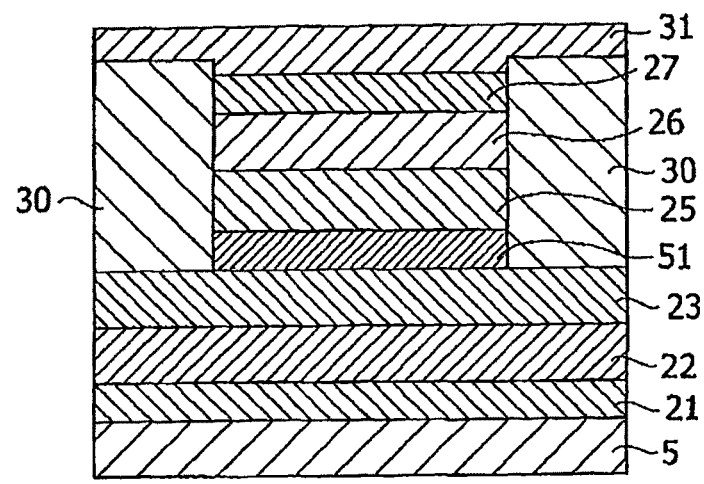
FIG. 2 is a cross-sectional view showing the basic configuration portion of a spin-valve element utilizing GMR.

A procedure for fabrication of a TMR-type spin-valve element is described below. The materials and film thicknesses used in each of the layers described below are examples. This spin-valve element is similar to the spin-valve element of FIG. 1 with respect to the cross-sectional structure perpendicular to the plane, and so the symbols of FIG. 1 are used in the explanation. First, a Cu thin film (30 nm) is formed as the electrode layer 21 on a substrate 5 which is for example a silicon wafer with an oxide film or similar layer, and thereafter CoFeB (35 nm) as the ferromagnetic layer 23 (hereafter called the "fixed layer 23"), MgO (0.6 nm) as the insulating layer 24, CoFeB (20 nm) as the ferromagnetic layer 25 (hereafter called the "free layer 25"), and Cu (2 nm) as the capping layer 26, are layered in succession. Further, a negative resist is applied, and electron beam exposure or a similar technique is used to perform patterning, followed by ion milling or dry etching, to form a spin-valve element with a circular shape having cutouts. In particular, if the resolution of electron beam exposure is inadequate to form minute cutouts, patterning by extreme ultraviolet (EUV) beam exposure can also be used. After further using a CVD method or similar technique to form an $SiO_2$ film, covering the side face of the circular-shape spin-valve element, lift-off is used to remove the resist from the spin-valve element, to form an upper electrode. Then, annealing is performed at 350 to 500° C. in a magnetic field of approximately several kOe, to determine the magnetization easy axis of the fixed layer.

In particular, when a fixed layer for readout 29 is formed as shown in FIG. 13A, TbFeCo, in which perpendicular magnetization orientation can easily be induced, is used as the fixed layer 23, and after depositing the free layer 25, similar processes may be used to form an MgO layer and CoFeB (20 nm) as a fixed layer for readout 29. In the case of a GMR-type spin-valve element, instead of the insulating layer 24, a non-magnetic layer 51 of Cu or similar substance is employed; otherwise essentially the same fabrication procedure is used.

As materials used to form the spin-valve element of an embodiment of the invention, a silicon substrate or glass substrate can be used as the substrate 5. In addition, a copper substrate, which is highly functional as a heat sink, can also be used; in this case, the copper substrate can be cooled using water cooling or another method as necessary. As the electrode layers 21, 29 and 31, Ta, Pt, Cu, Au, Ag, Al, or Mo can be used; as the antiferromagnetic layer 22, IrMn or PtMn can be used; as the fixed layer 23, CoFe, CoFeB, or materials in which perpendicular anisotropy can easily be induced, TbFe, TbFeCo, GdFe, GdFeCo, FePt, Co/Pt multilayered structures, Co/Pd multilayered structures, or similar structures are preferable; as the fixed layer for readout, CoFe or CoFeB can be used; as the insulating layer 24, MgO or an Al oxide can be used; as the nonmagnetic layer 51 Cu can be used; and as the free layer 25, in addition to the widely used CoFe and CoFeB, NiFe with small crystalline anisotropy is preferable; but the materials to be used are not limited thereto. Further, as the capping layer 27, Cu and Pd are representative examples, but the materials to be used are not limited thereto.

In order to manifest functions as a spin-valve element, the coercive force of the fixed layer 23 must be greater than that of the free layer 25. As a method to achieve this, a method is employed in which the materials of the fixed layer 23 and free layer 25 are the same, and the film thickness of the former is made greater than the film thickness of the latter, to impart a difference in coercive force. Further, an antiferromagnetic layer (pinning layer) 22 is added, so that through the antiferromagnetic coupling therewith, the coercive force of the fixed layer 23 is raised. Further, an antiferromagnetic coupled film such as CoFeB/Ru/CoFeB can be used as necessary. The crystallinity and magnetization easy axis direction of each of the layers, including the fixed layer, are controlled after layering these layers by annealing in a magnetic field.

(Example of Element Analysis)

Below, the results of studies of generation of the above-described vortices, and of conditions for fixing on cutouts, are described. Here, magnetic materials having the magnetic characteristics of Table 1 are assumed as the ferromagnetic materials. When materials having magnetic characteristics different from those described here are used, individual characteristic values will differ, but similar basic functionality is obtained.

Figure 14:
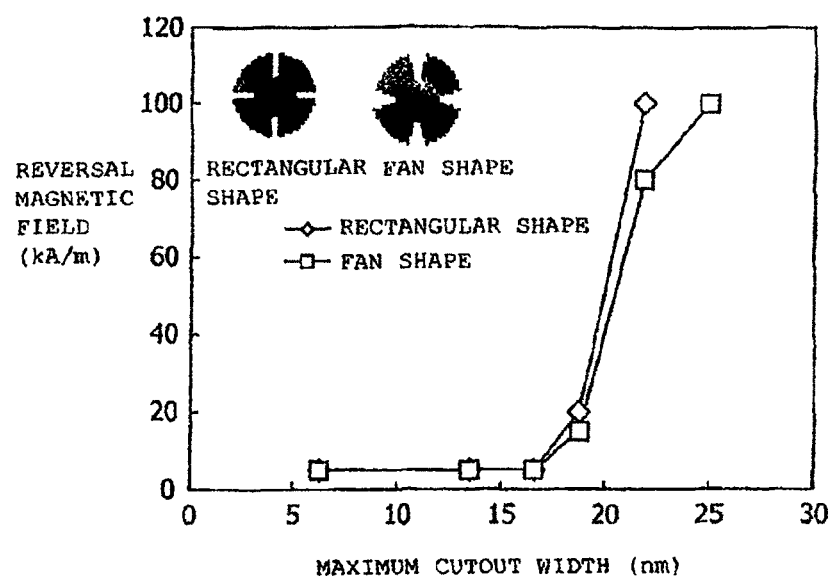
FIG. 14 is an explanatory diagram showing an example of the relation between cutout width and magnetization distribution in a spin-valve element of this invention.

FIG. 14 shows, for a spin-valve element having a free layer of diameter 100 nm and thickness 20 nm, with rectangular cutout shapes, the relation between the cutout width and the reversal magnetic field and magnetization distribution. Here, asymmetry is imparted to the cutouts, and the magnetization distribution is a vortex-shape magnetization which describes a circular arc at a cutout. As shown in FIG. 14, when the cutout shape is rectangular, if the cutout width exceeds 20 nm there is an abrupt increase in the reversal magnetic field. The same figure also shows, for cases in which the cutout shape is such that the cutout width is greater on the periphery side than on the center side (fan shape), the dependence on the periphery-side cutout width. Similarly to the case of a rectangular shape, in the case of a fan shape also, when the cutout width on the periphery side exceeds 20 nm there is an abrupt increase in the reversal magnetic field.

With respect to the reason for such behavior of the reversal magnetic field with the cutout width, the inventors of this application surmise that when the maximum width of the cutout exceeds 20 nm, the exchange interaction between magnetic film across the cutout is reduced, the effect of the shape anisotropy increases, and the reversal magnetic field increases. Based on this reasoning, attention was paid to the magnetic properties of the ferromagnetic material of the free layer, in order to determine the shape that cutouts should have in order to realize the above principle. That is, it was discovered that the shape of the above cutouts can be characterized by an exchange interaction distance L, expressed by the equation $$L = (\mu_0 A / Ms^2)^{0.5}$$

which serves as a guide to the effective distance of the exchange interaction. Here A is the exchange stiffness constant (J/m), Ms is the saturation magnetization (T), and $\mu_0$ is the permeability of vacuum (=1.257×10$^{-6}$ H/m).

Upon calculating the exchange interaction distance L for the materials shown in Table 1, the exchange interaction distance L for "material 1" used in this study is approximately 3.74 nm. By contrasting with the cutout maximum width of 20 nm obtained from the above study results, it is seen that a maximum cutout width Y such that Y≤5.5 L is desirable. Further, in the range studied, when the cutout width is smaller than the above L, no phenomenon of a vortex being fixed at a cutout were observed. From this it is thought desirable that all cutout widths Y satisfy the following condition.

$$L \leq Y \leq 5.5L$$

Figure 15:
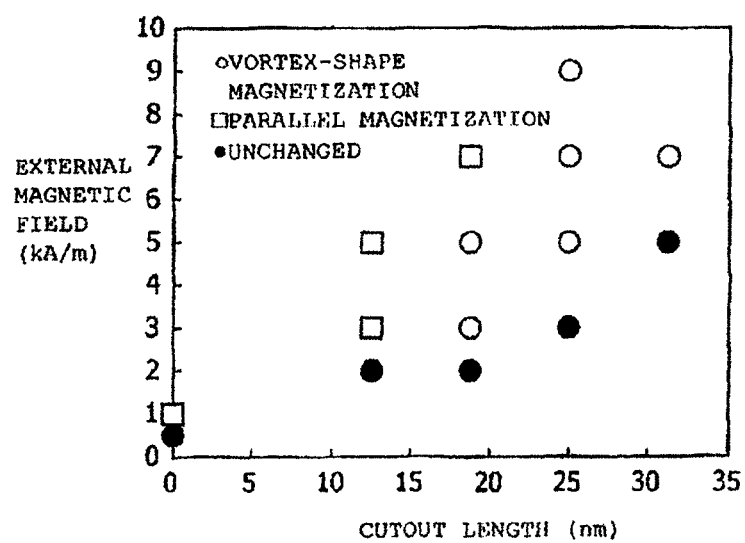
FIG. 15 is an explanatory diagram showing an example of the relation between cutout length and magnetization distribution in a spin-valve element of this invention.

Further, FIG. 15 shows the effect of the cutout length. When the cutout length X is 20 nm or less, the magnetization stability at a cutout is low, and rotational magnetization is not easily fixed. Hence even when the external magnetic field is changed, in-plane magnetization either does not change, or merely becomes parallel magnetization. On the other hand, when the cutout length X exceeds 20 nm, rotational magnetization stable states are obtained. The inventors of this application infer that the behavior is related to magnetostatic anisotropy energy depending on the shape of the overall magnetic film, and on the size (radius) of the locus of vortex rotational motion; these quantities are quantities which depend on the relative values for the magnetic film radius R (=50 nm), and so it is further preferable that the cutout length X satisfy the following equation.

$$X \geq 0.4R$$

When the free layer magnetic film is not perfectly circular, R can be the effective radius, calculated by the following equation with S as the area of the spin-valve element.

$$R = (S/\pi)^{0.5}$$

Figure 16:
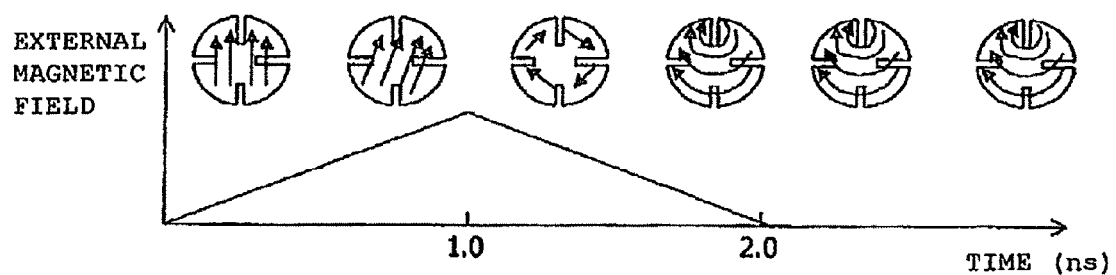
FIG. 16 is an explanatory diagram showing one example (analysis example 3) of magnetization behavior when an external magnetic field is applied to a spin-valve element of this invention.
Figure 17:
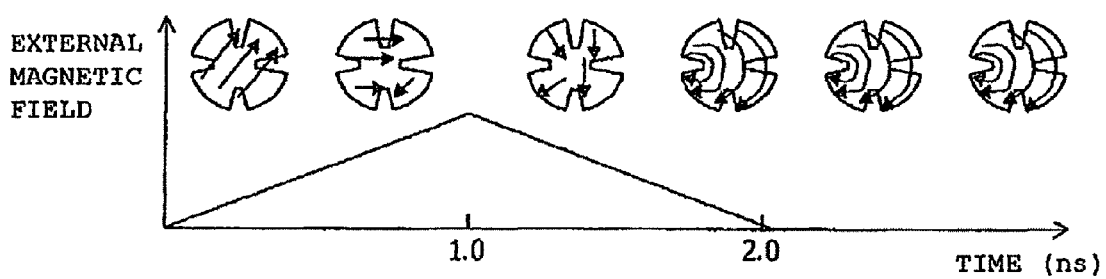
FIG. 17 is an explanatory diagram showing one example (analysis example 4) of magnetization behavior when an external magnetic field is applied to a spin-valve element of this invention.

Table 2 presents analysis examples and comparative examples, including the examples described above. Here, the "cutout shape" in Analysis Example 4 is fan-shaped, and in this case the "cutout width" in Table 2 indicates the values on the center side and on the periphery side respectively. Further, "asymmetry" in Table 2 indicates either a case in which all cutouts are congruent (X), or a case in which all cutouts are not congruent (O). In an (O) case, the length or the width is different for the cutout in the S position from the other three cutouts (N, E, W). The magnetization behavior for a number of analysis examples has already been presented in FIG. 4 (Comparative Example 1), FIG. 7 (Analysis Example 1), and FIG. 8 (Analysis Example 2). In addition, magnetization behavior is also shown in FIG. 16 (Analysis Example 3) and FIG. 17 (Comparative Example 4).

In Analysis Examples 1 through 9, it is seen that at the end of the external magnetic field pulse the magnetization vector is stabilized, and satisfactory recording is performed. On the other hand, when there are no cutouts (Comparative Example 1) the magnetization vector is not stabilized and a satisfactory recorded state is not obtained. And, when the cutout length is shorter than 20 nm (Comparative Example 2), and when the cutout width is greater than 20 nm (Comparative Example 3), write operations were not possible using an applied external magnetic field.

TABLE 2

| Property | Analysis Example 1 | Analysis Example 2 | Analysis Example 3 | Analysis Example 4 | Analysis Example 5 | Analysis Example 6 | Analysis Example 7 | Analysis Example 8 | Analysis Example 9 | Comparative Example 1 | Comparative Example 2 | Comparative Example 3 |
|---|---|---|---|---|---|---|---|---|---|---|---|---|
| Free layer materials | 1 | 1 | 1 | 1 | 1 | 1 | 1 | 2 | 3 | 1 | 1 | 1 |
| Thin film dia. (nm) | 100 | 100 | 100 | 100 | 100 | 100 | 200 | 200 | 100 | 100 | 100 | 100 |
| Thin film thickness (nm) | 20 | 20 | 20 | 25 | 20 | 20 | 20 | 20 | 20 | 25 | 20 | 20 |
| Number of cutouts | 4 | 4 | 4 | 4 | 4 | 4 | 4 | 4 | 4 | 0 | 4 | 4 |
| Cutout shape | rectangular | rectangular | rectangular | fan-shape | rectangular | rectangular | rectangular | rectangular | rectangular | — | rectangular | rectangular |
| Cutout width (nm) | 6 | 6 | 12 | 6/12 | 6 | 6 | 12 | 12 | 6 | — | 30 | 6 |
| Cutout length (nm) | 25 | 25 (28) | 25 (28) | 25 (28) | 25 (28) | 28 (25) | 50 (56) | 50 (56) | 25 (28) | — | 25 (28) | 15 (18) |
| Asymmetry | X | O: S cutout length (+3 nm) | O: S cutout length (+3 nm) | O: S cutout length (+3 nm) | O: S cutout length (+3 nm) | O: S cutout length (−3 nm) | O: S cutout length (+6 nm) | O: S cutout length (+6 nm) | O: S cutout length (+3 nm) | X | O: S cutout length (+3 nm) | O: S cutout length (+3 nm) |
| External magnetic field peak value (kA/m) | 5 | 5 | 7 | 10 | 5 | 5 | 10 | 15 | 100 | 5 | 7 | 7 |
| Magnetization final state | Stable in SW direction | Stable in S direction | Stable in N direction | Stable in W direction | Stable in S direction | Stable in N direction | Stable in S direction | Stable in S direction | Stable in W direction | Not stable | No change | No change |

(Storage Device Configuration)

Figure 18:
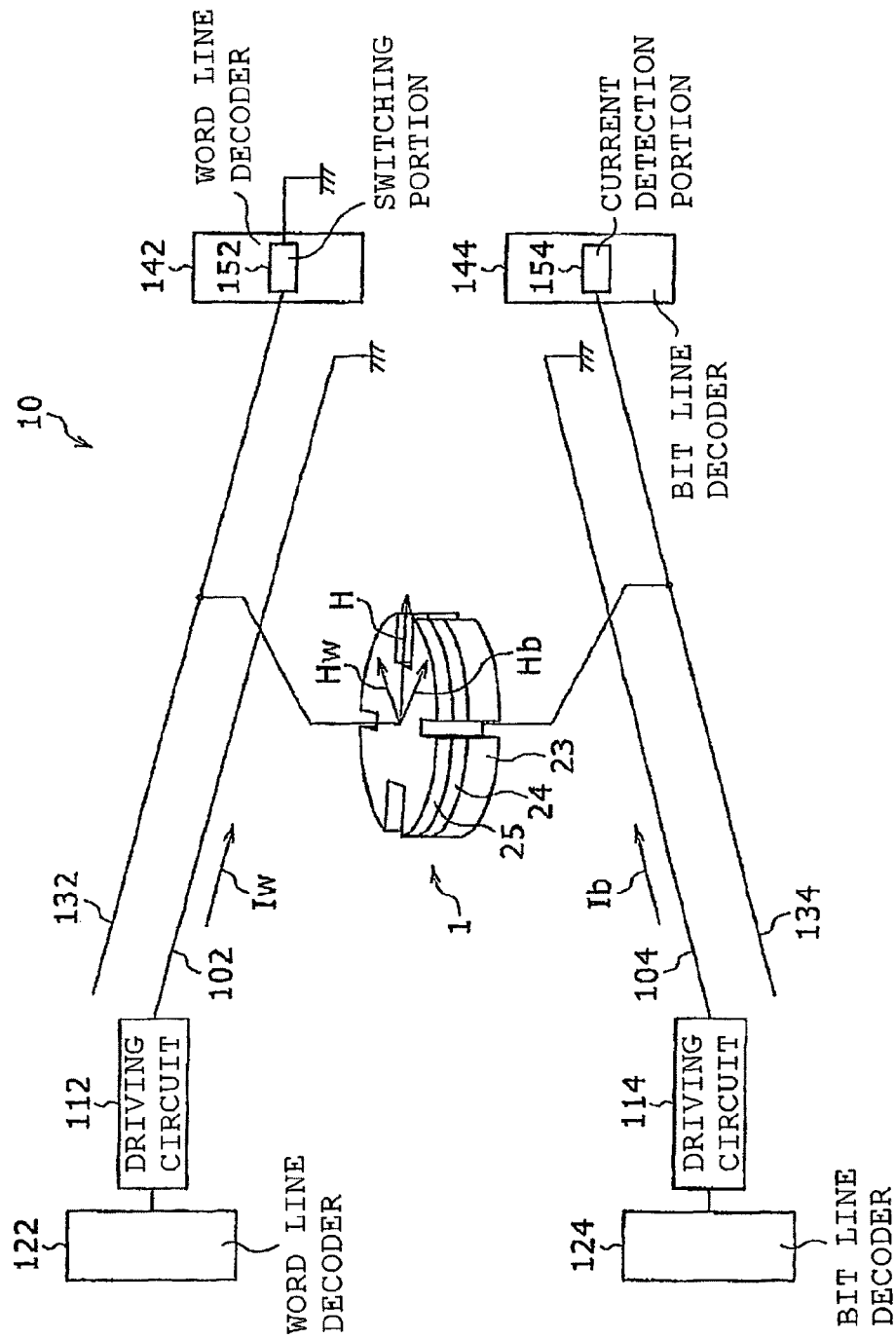
FIG. 18 is an explanatory diagram showing the configuration of a storage device using a spin-valve element of this invention.

FIG. 18 shows the configuration of a storage device when utilizing spin-valve elements of this invention. The spin-valve elements 1 have an in-plane shape like that of FIG. 6, and have a layer structure like that of FIG. 1. In FIG. 18, only a fixed layer 23, intermediate layer 24, and free layer 25 are shown, and except for the configuration of electrical wiring for addressing of same, details are omitted. In the implemented storage device, numerous spin-valve elements 1 are arranged in an array; FIG. 18 shows only one spin-valve element thereof.

A magnetic field generation word line 102 and magnetic field generation bit line 104, which pass currents to generate external magnetic fields applied to the free layer 25, are arranged for the spin-valve elements 1 of the storage device 10, and current driving circuits 112 and 114 are respectively connected to these lines. The current driving circuits are respectively connected to a word line decoder 122 and bit line decoder 124. The current driving circuits 112 and 114 include current amplification stages (not shown) to control current values based on instruction values from the connected decoders 122 and 124.

The current amplification stages control the current waveforms flowing in the lines 102, 104 according to instructions from the word line decoder 122 and bit line decoder 124, in order to apply currents $I_W$ and $I_b$ such that an external magnetic field necessary for writing is extended only to the spin-valve elements for which writing is necessary, and extends an external magnetic field such that writing does not occur in other spin-valve elements. In this embodiment, current waveform control causes a triangular wave with a rise and a fall to be applied as shown in FIG. 8 or similar waveform, and state writing is performed according to the peak value. Hence the current amplification stages amplify the triangular waveform from a triangular wave generation circuit (not shown) such that the current waveform necessary for each connected word and each bit results. The combined magnetic field H of the magnetic fields $H_w$ and $H_b$ created in the free layer 25 by the currents $I_w$ and $I_b$ respectively is the external magnetic field for each of the spin-valve elements.

A line 132 and a line 134 are also connected to a spin-valve element 1 of the storage device 10, in order to pass a current between the free layer 25 and the fixed layer 23 to detect the resistance value. A function of the fixed layer 23 is to enable differentiation of resistance values using the current flowing between this layer and the free layer 25 during data readout, and to this end, the magnetization of the fixed layer 23 is an in-plane magnetization directed other than along a symmetry axis, as explained in relation to FIG. 12C. The line 132 and the line 134 are connected to a word line decoder 142 and to a bit line decoder 144 for detection; the bit line decoder 144 is connected to a current source (not shown) to generate a current for detection and to a current detection portion 154, and the word line decoder 142 includes, for each word line, a switching portion 152 including a selection transistor.

The above explanation describes a write operation by an external magnetic field due to changes in a triangular waveform with rising and falling portions; however, similar write operations can be realized by a spin injection current applying a similar torque. In this case, the magnetic field generation word line 102, current driving circuit 112 and decoder 122, and the magnetic field generation bit line 104, current driving circuit 114 and decoder 124 shown in FIG. 18 are not used, but transistors or other switching elements and spin-valve elements are connected in series, and spin injection currents for writing are passed by the line 132 and the line 134.

With respect to readout operations, when a readout instruction is received, first the word line decoder 142 uses a selection transistor to connect the word line of the readout word to the power supply or to ground or similar, and cancels the connections for other words. In the readout word, because the word line 132 is connected to the power supply or to ground, a current or voltage from the bit line decoder 144 is applied to the target spin-valve element, and the current or voltage at that time can be detected.

In the above, means have been provided for reducing the magnetization reversal current and for faster magnetization reversal in a spin-valve element with spin-injection magnetization reversal. Embodiments of the invention have been described, but the invention is not limited to the aforementioned embodiments, and various modifications, alterations, and combinations are possible based on the technical concepts of the invention.

The invention claimed is:

1. An improved spin-valve element, which has an intermediate layer containing an insulating layer or a nonmagnetic layer, and a pair of ferromagnetic layers sandwiching the intermediate layer, and in which coercive forces of the pair of ferromagnetic layers are mutually different, wherein the improvement comprises:
the ferromagnetic layer with the smaller coercive force is a unitary member which has a top side, a bottom side, and an in-plane shape that is substantially circular but is provided, in a peripheral portion thereof, with a plurality of cutouts that extend from the top side to the bottom side,
wherein the shape of at least one of the plurality of cutouts is not congruent with other cutouts, the not-congruent shape being such that said at least one of the cutouts is longer than at least one other cutout so as to obtain a stable vortex magnetization distribution.

2. The spin-valve element according to claim 1, wherein the in-plane shape of the spin-valve element is substantially circular, with a major axis:minor axis aspect ratio thereof being 1:1 or greater and 102:98 or smaller.

3. The spin-valve element according to claim 1, wherein a minimum value X of the cutout length satisfies the following equation:

$$X \geq 0.4R$$

where R is an effective radius of the spin-valve element, and the effective radius is defined as $(S/\pi)^{0.5}$, where S is the area of the spin-valve element.

4. The spin-valve element according to claim 1, wherein widths Y of all cutouts satisfy the following equation:

$$L \leq Y \leq 5.5L$$

where L is defined by $L=(\mu_0 A/Ms^2)^{0.5}$ and is an exchange interaction distance of the ferromagnetic material having lower coercive force among the pair of ferromagnetic layers, A is an exchange stiffness constant (J/m), Ms is a saturation magnetization (T) of the material of the ferromagnetic layer having the lower coercive force, and $\mu_o$ is a permeability of vacuum, equal to $1.257 \times 10^{-6}$ (H/m).

5. A storage device, which uses as a storage element the spin-valve element according to claim 1.

6. An improved spin-valve element, which has an intermediate portion sandwiched between first and second ferromagnetic layers, wherein the improvement comprises:

the first ferromagnetic layer is a unitary member that has a central region and that additionally has an outer periphery with a plurality of cutout portions that extend toward the central region,
wherein outer periphery of the first ferromagnetic layer is generally circular in shape, except for the cutout portions, and
wherein at least one of the cutout portions has a length that is longer than the length of at least one other cutout portion so as to obtain a stable vortex magnetization distribution.

7. The spin-valve element according to claim 6, wherein the in-plane shape of the spin-valve element has a major axis:minor axis aspect ratio of 1:1 or greater and 102:98 or smaller.

8. The spin-valve element according to claim 6, wherein a minimum value X of the cutout portion length satisfies the following equation:

$$X \geq 0.4R$$

where R is an effective radius of the spin-valve element, and the effective radius is defined as $(S/\pi)^{0.5}$, where S is the area of the spin-valve element.

9. The spin-valve element according to claim 6, wherein widths Y of all cutout portions satisfy the following equation:

$$L \leq Y \leq 5.5L$$

where L is defined by $L=(\mu_0 A/Ms^2)^{0.5}$ and is an exchange interaction distance of the ferromagnetic layer having the lower coercive force, A is an exchange stiffness constant (J/m), Ms is a saturation magnetization (T) of the material of the ferromagnetic layer having the lower coercive force, and $\mu_0$ is a permeability of vacuum, equal to $1.257 \times 10^{-6}$ (H/m).

10. The spin-valve element according to claim 6, wherein the outer periphery of the first ferromagnetic layer additionally has arcuate portions between the cutout portions.

11. The spin-valve element according to claim 6, wherein there are four cutout portions, two of which are disposed along a first line and the other two of which are disposed along a second line that is substantially perpendicular to the first line.

12. A spin-valve element, comprising:
a pair of ferromagnetic layers having different coercive forces; and
a unitary intermediate layer sandwiched between the ferromagnetic layers, the intermediate layer containing at least one of an insulating layer and a nonmagnetic layer,
wherein the ferromagnetic layer with the smaller coercive force is substantially circular but is provided, at its periphery, with a plurality of cutouts, at least one of the cutouts having a length that is different from other cutouts or a width that is different from other cutouts,
wherein the spin-valve element has an in-plane shape that is substantially circular, with a major axis to minor axis aspect ratio thereof being one to one or greater and 102 to 98 or smaller,
wherein a minimum value X of the cutout lengths satisfies the relationship $X \geq 0.4R$, where R is an effective radius of the spin-valve element, and the effective radius is defined as $(S/\pi)^{0.5}$, where S is the area of the spin-valve element, and
wherein the cutouts have widths that satisfy the relationship $L \leq Y \leq 5.5L$, where L is defined by $L=(\mu_0 A/Ms^2)^{0.5}$ and is an exchange interaction distance of the ferromagnetic material having lower coercive force among the pair of ferromagnetic layers, A is an exchange stiffness constant (J/m), Ms is a saturation magnetization (T) of the material of the ferromagnetic layer having the lower coercive force, and $\mu_0$ is a permeability of vacuum, equal to $1.257 \times 10^{-6}$ (H/m).

13. The spin-valve element according to claim 12, wherein said plurality of cutouts is four cutouts.

14. The spin-valve element according to claim 13, and further comprising first and second writing electrodes disposed adjacent the free layer.

15. The spin-valve element according to claim 12, wherein the pair of ferromagnetic layers are a fixed layer and a free layer.

16. The spin-valve element according to claim 12, wherein the spin-valve element is a storage element.

* * * * *